(12) United States Patent
Edwards

(10) Patent No.: US 8,531,194 B2
(45) Date of Patent: Sep. 10, 2013

(54) SELECTABLE THRESHOLD RESET CIRCUIT

(75) Inventor: William E. Edwards, Ann Arbor, MI (US)

(73) Assignee: Freescale Semiconductor, Inc., Austin, TX (US)

( * ) Notice: Subject to any disclaimer, the term of this patent is extended or adjusted under 35 U.S.C. 154(b) by 357 days.

(21) Appl. No.: 13/071,025

(22) Filed: Mar. 24, 2011

(65) Prior Publication Data

US 2012/0242380 A1     Sep. 27, 2012

(51) Int. Cl.
    *G01R 27/02* (2006.01)
(52) U.S. Cl.
    USPC .......................................... 324/713; 327/143
(58) Field of Classification Search
    USPC .......................................... 324/713; 327/142
    See application file for complete search history.

(56) References Cited

U.S. PATENT DOCUMENTS

| | | |
|---|---|---|
| 5,103,113 A | 4/1992 | Inui et al. |
| 5,115,146 A | 5/1992 | McClure |
| 5,149,987 A | 9/1992 | Martin |
| 5,181,203 A | 1/1993 | Frenkil |
| 5,331,209 A | 7/1994 | Fujisawa et al. |
| 5,394,104 A | 2/1995 | Lee |
| 5,450,417 A | 9/1995 | Truong et al. |
| 6,073,263 A | 6/2000 | Arkin et al. |
| 6,144,237 A | 11/2000 | Ikezaki |
| 6,188,257 B1 | 2/2001 | Buer |
| 6,367,024 B1 | 4/2002 | Ezell |
| 6,618,312 B2 | 9/2003 | Cheung et al. |
| 7,057,427 B2 | 6/2006 | Wadhwa et al. |
| 7,142,024 B2 | 11/2006 | Youssef |
| 7,265,595 B1 | 9/2007 | Kutz et al. |
| 7,519,486 B2 | 4/2009 | Ng et al. |
| 7,710,105 B2 | 5/2010 | Chan et al. |
| 7,711,971 B1 | 5/2010 | Jurgilewicz |

Primary Examiner — Vincent Q Nguyen

(57) ABSTRACT

A low voltage testing circuit (125), system (100 and 200), and method for performing low-voltage testing of a circuit (127) in an integrated circuit package (104 and 204) include a selectable threshold reset circuit (125) that includes a voltage-divider ladder (320) that produces a voltage that is a fraction of a power supply voltage, a comparator (310) that compares the fraction with a reference voltage, a switch (350) that controls topology of the voltage-divider ladder thereby changing a value of the fraction, the switch controlled by a signal from a production tester (102 and 202), the signal causing a reset threshold of the selectable threshold reset circuit to be reduced below a normal reset threshold to allow testing of the circuit at a power supply voltage below the normal reset threshold.

20 Claims, 4 Drawing Sheets

SELECTABLE THRESHOLD RESET CIRCUIT

BACKGROUND

1. Field

This invention relates generally to reset circuits, and more specifically to a reset circuit that can be used during a low voltage test of a circuit within an integrated circuit package.

2. Related Art

A packaged integrated circuit comprises at least one die that is typically encapsulated in ceramic, plastic insulation, or resin, which constitute packaging. One or more circuits are integrated onto the die. For a normally encapsulated die, the only coupling of signals between the circuits on the die and locations outside the packaging is with metal pins through the packaging. However, there are signals that exist within the packaging that do not appear at a metal pin. Therefore, for a typically packaged integrated circuit, a signal that only exists within the packaging cannot be readily accessed.

After packaging of the die, a circuit on the die may need to be tested to determine whether it is still operating properly at a voltage lower than a nominal power supply voltage. This is called low voltage testing which is used to ensure that a circuit meets speed and timing requirements, in contrast to high voltage testing which is used to stress gate oxides. This is also called after-package, or package-level, testing in which the only accessible test points are the metal pins through the packaging, in contrast to chip-probing, or wafer-level testing, in which additional locations on the die are accessible as test points.

A digital circuit cannot be relied upon to operate predictably when the voltage of its power supply goes below a certain level, a reset threshold voltage. Therefore, a low voltage detection circuit is used to monitor the power supply and to force the digital circuit into reset before the voltage of the power supply voltage goes too low. A low voltage detection circuit that resets another circuit is called a reset circuit or a power-on reset (POR) circuit. When the power supply voltage is below the reset threshold voltage, the reset circuit outputs a RESET signal that that forces the digital circuit into reset, which includes turning off the digital circuit. It is important that the digital circuit still be operating properly when it is reset. After-package, or package-level, testing includes testing whether the digital circuit is operating properly when it is reset.

One way to ensure that a digital circuit is operating properly at the reset threshold voltage is to determine that it operates properly at a voltage below the reset threshold voltage. In order to test that a digital circuit operates properly at a voltage below the reset threshold voltage, it is necessary to first reduce the power supply voltage for the digital circuit under test to a voltage below the reset threshold voltage. A digital circuit under test is coupled to a reset circuit, and, typically, both are located within a same integrated circuit package, usually on a same die. However, known reset circuits output the RESET signal and turn off the digital circuit under test before the power supply voltage reaches any voltage below the reset threshold voltage, thereby preventing execution of the low voltage test.

A first known method of overcoming the above-described, and of determining whether a digital circuit is operating properly at the reset threshold voltage is to override the RESET signal outputting by the known reset circuit, and then to lower the voltage of the power supply for the digital circuit ("to override" the RESET signal means to force it to not change state). Next, a determination is made whether the digital circuit is still operating properly at the lower power supply voltage. The first known method is relatively easy to accomplish only if the RESET signal is readily accessible, such as appearing at a pin of an integrated circuit package in which the digital circuit and the reset circuit reside.

A second known method of overcoming the above-described, and of determining whether a digital circuit is operating properly at the reset voltage is to design an integrated circuit having a test mode, which, when entered into, inhibits generation of the RESET signal. As with the first known method, with the second known method, the integrated circuit that has the test mode also includes both the digital circuit under test and the reset circuit. Typically, such an integrated circuit communicates with a microprocessor via a communications port. As result of programming, the microprocessor signals the integrated circuit to enter the test mode. Disadvantageously, it is possible for the integrated circuit to inadvertently enter into the test mode, and if the test mode has been inadvertently entered, it is not easy to determine that the integrated circuit has exited from the test mode.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
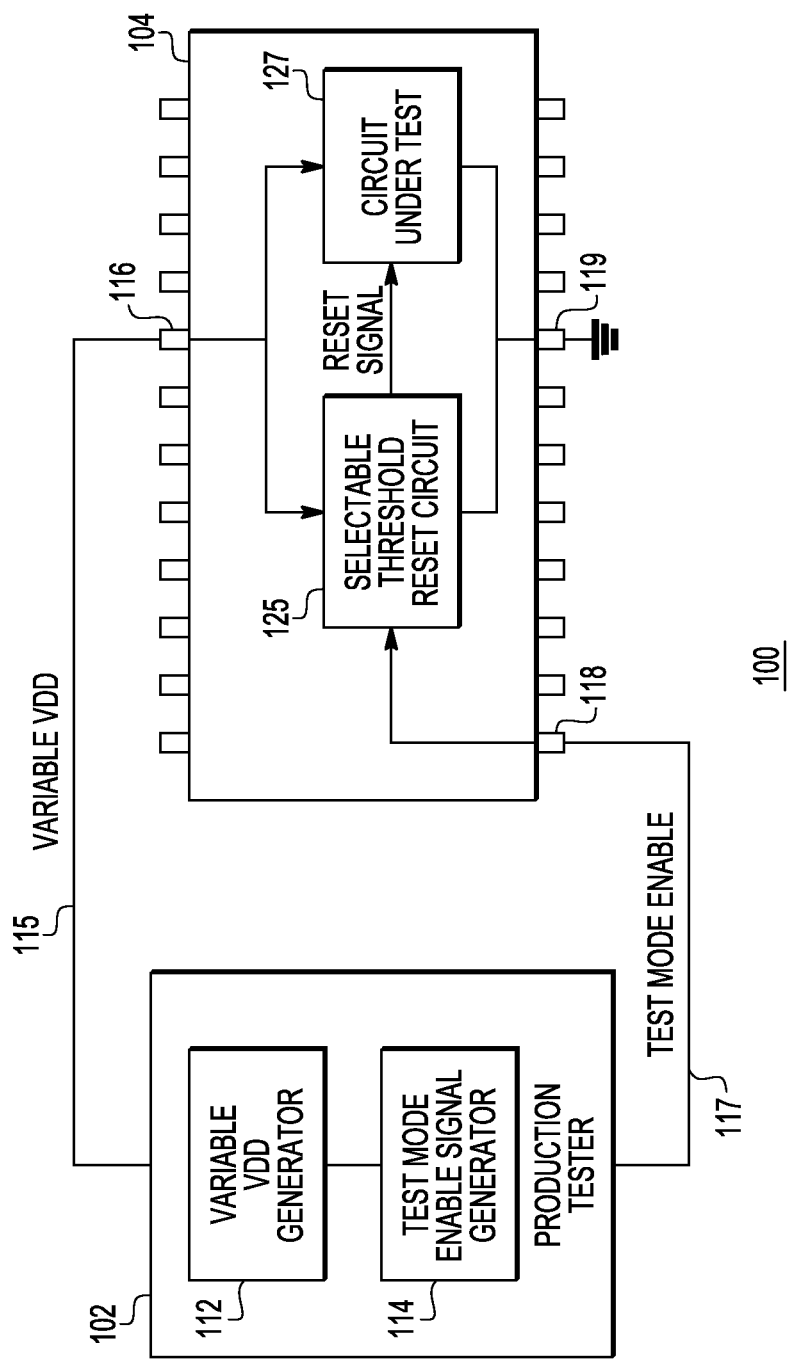
FIG. 1 is a simplified functional block diagram of a low voltage testing system in accordance with one embodiment of the invention, which includes a selectable threshold reset circuit.

FIG. 1 is a simplified functional block diagram of a low voltage testing system 100 in accordance with one embodiment of the invention. The low voltage testing system 100 comprises a production tester 102 coupled to an integrated circuit package 104. The production tester 102 includes a variable $V_{DD}$ generator 112 and a test mode enable signal generator 114 coupled to the variable $V_{DD}$ generator 112. The production tester 102 is coupled, via a first line 115, to a pin 116 of the integrated circuit package 104 to convey a variable voltage to circuit s within the integrated circuit package. The production tester 102 is also coupled, via a second line 117, to a test pin 118 of the integrated circuit package 104 to convey a TEST MODE ENABLE signal to the integrated circuit package 104. The integrated circuit package 104 also includes a pin 119 that can be coupled to ground potential.

The integrated circuit package 104 further includes a selectable threshold reset circuit 125 and a circuit under test 127. In one embodiment, the selectable threshold reset circuit 125 is a Power-On Reset (POR) circuit. The circuit under test 127 can include only digital circuitry, only analog circuitry, it can include both digital and analog circuitry, or it can be a mixed mode circuit that includes analog, digital and power circuits, or it can be any other type of circuit. The selectable threshold reset circuit 125 outputs a RESET signal to the circuit under test 127 when a power supply voltage, $V_{DD}$, is less than the reset threshold voltage ("reset threshold"). Typically, the RESET signal is outputted when a power supply voltage level reduces to about 80% of a nominal power supply voltage level. Advantageously, the selectable threshold reset circuit 125 does not disable the outputting of the RESET signal upon occurrence of the reset threshold. Instead, the selectable threshold reset circuit 125 selectively changes the reset threshold. The selectable threshold reset circuit 125 selectively reduces the voltage level of the power supply at which the selectable threshold reset circuit outputs the RESET signal. In one embodiment, the lower reset threshold, or test mode reset threshold, is about 80% of the power supply voltage. In another embodiment, the lower reset threshold is at a value other than about 80% of the power supply voltage. The actual value of the lower reset threshold depends on values of components in the selectable threshold reset circuit 125. The selectable threshold reset circuit 125 lowers the value of the reset threshold, which is the voltage at which the RESET signal occurs, when a low voltage testing mode (hereinafter "test mode") is enabled. In one embodiment, when $V_{DD}$ is 2.5V, the normal reset threshold is typically 2.0V (80% of $V_{DD}$). In such embodiment, there is a need to determine whether the circuit under test 127 functions properly when the power supply voltage is at a voltage less than the normal reset threshold, for example, at 1.75V. The low voltage testing system 100 allows such determination to be easily made by lowering the reset threshold to a voltage less than the normal reset threshold, for example, to 1.65V. The integrated circuit package 104 includes an integrated circuit (not shown) that includes the selectable threshold reset circuit 125 and the circuit under test 127, and the integrated circuit may include additional circuits that are not illustrated in FIG. 1. The production test 102 varies the voltage level of $V_{DD}$ for all circuits within the integrated circuit package 104, including for circuits not illustrated in FIG. 1.

Figure 2:
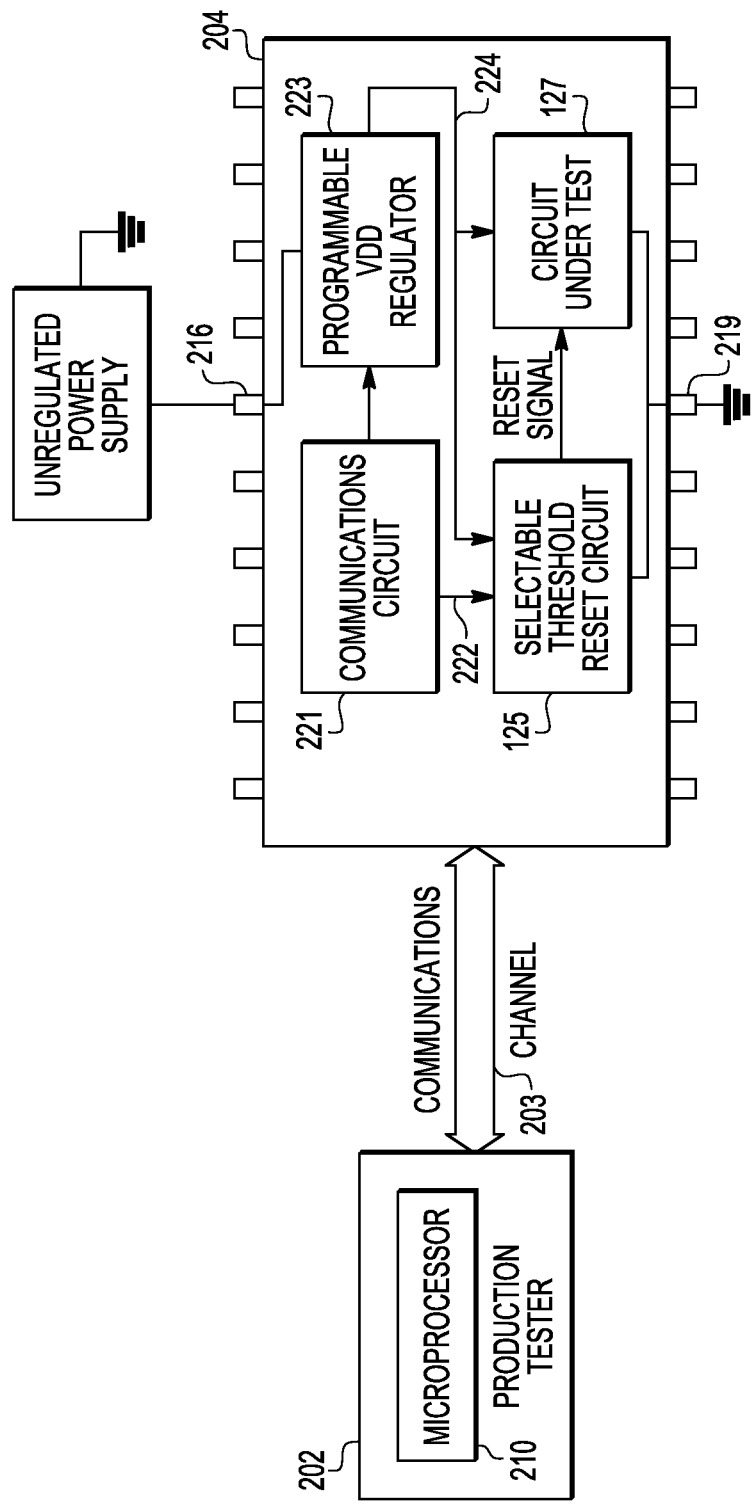
FIG. 2 is a simplified functional block diagram of a low voltage testing system in accordance with another embodiment of the invention, which includes the selectable threshold reset circuit.

FIG. 2 is a simplified functional block diagram of a low voltage testing system 200 in accordance with another embodiment of the invention. The low voltage testing system 200 comprises a production tester 202 coupled to an integrated circuit package 204. The production tester includes a microprocessor 210. The production tester 202 is coupled to the integrated circuit package 204 via a communications channel 203. In one embodiment, the communications channel 203 is a Serial Peripheral Interface (SPI) communications channel comprising a clock line, a chip select line, a data-in line and a data-out line, coupled to four pins (not shown) of the integrated circuit package 204. The integrated circuit package 204 comprises a pin 216 and a pin 219 that can be coupled to an unregulated power supply 220. The integrated circuit package 204 comprises a communications circuit 221 that is coupled to the communications channel 203. The communications circuit 221 is coupled to a selectable threshold reset circuit 125 via line 222. Via the line 222, the communications circuit 221 provides the TEST MODE ENABLE signal to the selectable threshold reset circuit 125, as directed by the production tester 202. The communications circuit 221 is also coupled to a programmable $V_{DD}$ regulator 223. The programmable $V_{DD}$ regulator 223 can be coupled to the unregulated power supply 220 via pin 216 and pin 219. The programmable $V_{DD}$ regulator 223 produces at least two voltage levels of $V_{DD}$ for powering circuits within the integrated circuit package 204. The programmable $V_{DD}$ regulator 223 is coupled, via a line 224, to the selectable threshold reset circuit 125 and to a circuit under test 127.

The programmable $V_{DD}$ regulator 223 provides, via the line 224 and as directed by the production tester 202, one of at least two voltage levels of $V_{DD}$ to the selectable threshold reset circuit 125 and to the circuit under test 127. One voltage level of $V_{DD}$ is at a nominal power supply voltage level. Another voltage level of $V_{DD}$ is at a reduced level with respect to the nominal power supply voltage level. A same voltage level of $V_{DD}$ is concurrently provided to the selectable threshold reset circuit 125 and the circuit under test 127. When the programmable $V_{DD}$ regulator 223 provides the voltage level of $V_{DD}$ that is at the reduced level with respect to the nominal power supply voltage level, the communications circuit 221 concurrently provides the TEST MODE ENABLE signal to the selectable threshold reset circuit 125, thereby selecting a reduced threshold for the selectable threshold reset circuit 125. When the programmable $V_{DD}$ regulator 223 is providing the reduced $V_{DD}$ to the circuit under test 127 (and while the selectable threshold reset circuit 125 is selected to operate at the reduced threshold), the circuit under test can be, and is, tested to determine, inter alia, whether it operates properly at such reduced $V_{DD}$.

The integrated circuit package 204 may contain circuits not illustrated in FIG. 2. For example, the programmable $V_{DD}$ regulator 223 may be coupled to, and supply a regulated $V_{DD}$ voltage, to other circuits (not shown) in the integrated circuit package 204 that are not being test. Because such other circuits are not being test, when the programmable $V_{DD}$ regulator 223 reduces the voltage of $V_{DD}$ going to the circuit under test 127, the programmable $V_{DD}$ regulator may not reduce the voltage level of $V_{DD}$ going to such other circuits.

Figure 3:
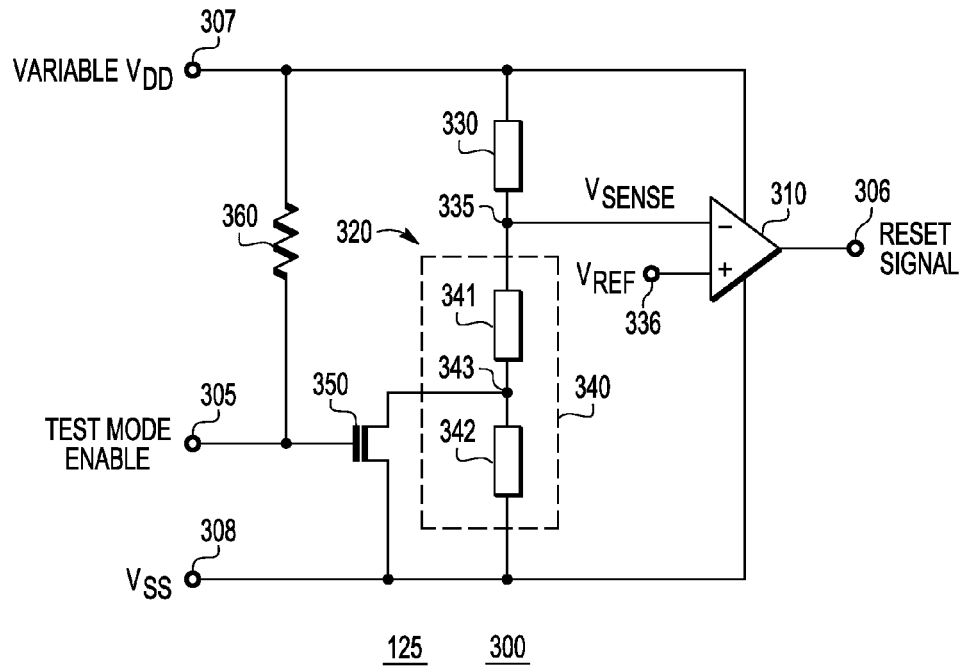
FIG. 3 is a schematic diagram of a circuit of a first embodiment of the selectable threshold reset circuit of FIGS. 1 and 2.

FIG. 3 is a schematic diagram of a circuit 300 of a first embodiment of the selectable threshold reset circuit 125. The circuit 300 includes a comparator 310. In the circuit 300, the comparator 310 is a self-biased comparator, i.e., the comparator 310 creates its own reference voltage, $V_{REF}$. In one embodiment, the comparator 310 is a broken bandgap comparator that compares a bandgap voltage of the integrated circuit to a percentage of the power supply voltage $V_{DD}$. In one embodiment, the bandgap voltage, and, therefore $V_{REF}$, is approximately 1.25V. The value of the percentage depends upon the values of components in the selectable threshold reset circuit 125 as explained hereinbelow. When the power supply voltage is high, the output of the comparator 310 is in a first state. When the power supply voltage is reduced to a low enough voltage, the output of the comparator 310 changes state. The selectable threshold reset circuit 125 reduces the voltage at which the comparator 310 changes the state, as the power supply voltage of the selectable threshold reset circuit 125 is reduced. The selectable threshold reset circuit 125 accomplishes this by increasing the percentage of the power supply voltage $V_{DD}$ that the comparator 310 compares to $V_{REF}$ while the value of $V_{REF}$ remains constant. The reduction in the voltage level of the power supply of the comparator 310 to the voltage level of the low voltage test does not adversely affect the operation of the comparator because the comparator is designed for a large power supply voltage range. By reducing the voltage at which the comparator 310 changes state as the power supply voltage of the selectable threshold reset circuit 125 is reduced, the reset threshold of the selectable threshold reset circuit is advantageously reduced.

The circuit 300 has an input terminal 305 for receiving the TEST MODE ENABLE signal and an output terminal 306 for outputting a RESET signal. The comparator 310 includes a first input terminal at node 335, and a second input terminal 336. An output terminal of the comparator 310 is the output terminal 306 of the circuit 300. The circuit 300 includes a voltage-divider circuit coupled between a $V_{DD}$ terminal 307 and a $V_{SS}$ terminal 308. In one embodiment, the voltage-divider circuit is a voltage-divider ladder (hereinafter "ladder") 320, coupled between a $V_{DD}$ terminal 307 and a $V_{SS}$ terminal 308. In one embodiment, the ladder 320 comprises a resistive element in an upper portion 330 and resistive elements 341 and 342 in a lower portion 340. Each resistive element may comprise one or more resistor(s). In addition, each resistive element may include tweaking resistors (not shown). The ladder 320 includes a node 335 between the upper portion 330 and the lower portion 340. The ladder 320 produces a voltage $V_{SENSE}$ at node 335. The voltage $V_{SENSE}$ at node 335 is an indirect measure of $V_{DD}$. The voltage $V_{SENSE}$ at node 335 is a fraction of $V_{DD}$. The value of the fraction is a ratio of the resistance above node 335 to the resistance below node 335. The comparator 310 compares the voltage $V_{SENSE}$ generated at node 335 and inputted into its first input terminal to the constant voltage $V_{REF}$ generated by a bandgap voltage reference circuit and inputted into its second input terminal 336.

The circuit 300 includes a switch 350 for controlling a functional topology of the ladder. In the circuit 300, the switch 350 is an NMOS transistor that has a gate coupled to the input terminal 305, a drain coupled to an intermediate node 343 between the resistive elements 341 and 342 of the lower portion 340, and a source coupled to the $V_{SS}$ terminal 308.

The production tester 102 and 202 causes circuit 300 to receive an active-low TEST MODE ENABLE signal, thereby causing the circuit 300 to enter the test mode. The active-low TEST MODE ENABLE signal causes the NMOS transistor of the switch 350 to turn off, or not conduct, and the selectable threshold reset circuit 125 thereby enters the test mode. The NMOS transistor of the switch 350 requires a low (logical zero) input signal at its gate to turn off.

When the circuit 300 is not in the test mode, the NMOS transistor is on, and it shorts outs resistive element 342 from the lower portion 340 of the ladder 320, thereby reducing the resistance of the lower portion of the ladder. When the NMOS transistor of the switch 350 is on, and a certain percent of the power supply voltage is sampled at node 335. When circuit 300 of the selectable threshold reset circuit 125 is in the test mode (as a result of receiving the active-low TEST MODE ENABLE signal), the NMOS transistor of the switch 350 is off, and the percent of the power supply voltage that is being sampled at node 335 changes. When NMOS transistor of the switch 350 is off, the percent of the power supply voltage that is being sampled at node 335 increases. By increasing the percent of the power supply voltage that is being sampled at node 335, the reset threshold of the circuit 400 is lowered to the test mode reset threshold. Of course, the threshold of the comparator 310 remains, at all times, unchanged at about 1.25V in the one embodiment.

The circuit 300 includes a pullup resistor 360 coupled between the gate of the NMOS transistor of the switch 350 and the $V_{DD}$ terminal 307. In the absence of a low TEST MODE ENABLE signal from the communications circuit 221 (see FIG. 2), the pullup resistor 360 advantageously maintains the NMOS transistor of the switch 350 in an ON state. If second line 117 (see FIG. 1), which carries the TEST MODE ENABLE signal from the production tester 102 to the integrated circuit package 104, breaks, the pullup resistor 360 advantageously maintains the NMOS transistor of the switch 350 in the ON state. As a result, circuit 300 of the selectable threshold reset circuit 125 does not enter the test mode if second line 117 breaks, and the reset threshold remains at its normal value.

The RESET signal is asserted by the selectable threshold reset circuit 125 when:

$$V_{SENSE} = V_{REF} \quad \text{Equation (1)}$$

When circuit 300 of the first embodiment of the selectable threshold reset circuit 125 is in the test mode:

$$V_{SENSE} = V_{DD}[(R_{341}+R_{342})/(R_{330}+R_{341}+R_{342})] \quad \text{Equation (2)}$$

By combining Equations (1) and (2), it can be seen that the RESET signal is asserted by circuit 300 when $$V_{DD} = V_{REF} \times (R_{330}+R_{341}+R_{342})/(R_{341}+R_{342}) \quad \text{Equation (3)}$$

Typical values for one embodiment are: $V_{DD}$=2.5V, $V_{REF}$=1.25V, and test mode reset threshold=1.65V. When in test mode, the ladder has a total resistance $R_{TOTAL}=R_{330}+R_{341}+R_{342}$. The circuit 300 is designed so that, in the one embodiment, when in the test mode, the total current $I_{TOTAL}$ through the ladder is approximately 50 μA.

$$V_{DD}/I_{TOTAL} = R_{TOTAL}$$

Upon inserting typical values into the above equation, a value for $R_{TOTAL}$ can be determined to be:

2.5V/50 μA=50 kΩ

In such embodiment, in normal mode, $I_{TOTAL}$ is more than 50 μA; however, the circuit 300 is designed to tolerate more than 50 μA.

$$V_{SENSE}/V_{DD} = (R_{341}+R_{342})/(R_{330}+R_{341}+R_{342})$$

$$V_{SENSE}/V_{DD} = (R_{341}+R_{342})/R_{TOTAL}$$

$$(R_{341}+R_{342}) = R_{TOTAL} \times V_{SENSE}/V_{DD} \quad \text{Equation (4)}$$

At both the normal reset threshold and the test mode reset threshold of the selectable threshold reset circuit 125, $V_{REF}=V_{SENSE}$=1.25V. When the selectable threshold reset circuit 125 is in the test mode, $V_{DD}$ is set to 1.65V by the production tester 102 and 202. When typical values are inserted into Equation (4), the resistance of the lower portion 340 of the ladder 320 of circuit 300, can be determined.

$$(R_{341}+R_{342}) = 50\ k\Omega \times 1.25V/1.65V$$

$$(R_{341}+R_{342}) = 37.88\ k\Omega$$

Therefore, $$R_{330} = R_{TOTAL} - (R_{341}+R_{342}) = 50\ k\Omega - 37.88\ k\Omega = 12.1\ k\Omega.$$

When the selectable threshold reset circuit 125 is not in the test mode, $R_{342}$ of circuit 300 is bypassed by the switch 350, and, in the equation (3) above, $R_{342}$ can be given a value of zero ohms, as indicated in the following equations.

$$V_{DD} = V_{REF} \times (R_{330}+R_{341}+0)/(R_{341}+0)$$

$$V_{DD} = V_{REF} \times (R_{330}+R_{341})/R_{341}$$

$$R_{341} = (V_{REF} \times R_{330})/(V_{DD}-V_{REF})$$

When the selectable threshold reset circuit 125 is not in the test mode, $V_{DD}$ may be as low as 2V and still operate because the normal reset threshold is approximately 2V, therefore, $$R_{341} = (1.25V \times 12.1\ k\Omega)/(2V-1.25V)$$

$$R_{341} = 20.17\ k\Omega$$

Therefore, $$R_{342} = 37.88\ k\Omega - 20.17\ k\Omega = 17.7\ k\Omega.$$

In a similar manner, values for resistive elements and resistors in other embodiments (see FIGS. 4 and 5) of the selectable threshold reset circuit 125 can be calculated.

In another embodiment (not shown) of the circuit 300, an operational amplifier circuit replaces the ladder 320, the switch 350 and the pullup resistor 360. The operational amplifier circuit is coupled between the $V_{DD}$ terminal 307 and the comparator 310. The operational amplifier circuit is also coupled to the input terminal 305 to receive the TEST MODE ENABLE signal. The operational amplifier circuit changes the percentage of $V_{DD}$ that appears at the negative input terminal of the comparator 310 in response to a value of the TEST MODE ENABLE signal. The operational amplifier circuit includes an operational amplifier, and resistors or other passive elements that set the gain k, where k<1. An output signal of the operational amplifier circuit is $V_{DD}$/k. An input terminal of the operational amplifier is connected to the $V_{DD}$ terminal 307 and another input terminal of the operational amplifier is connected to ground or to another reference, e.g., a band gap reference. The output terminal of the operational amplifier is connected to the negative input terminal of the comparator 310. In still another embodiment (not shown) of the circuit 300, switched-capacitors replace the resistors of the ladder 320, and a timing clock is added.

Figure 4:
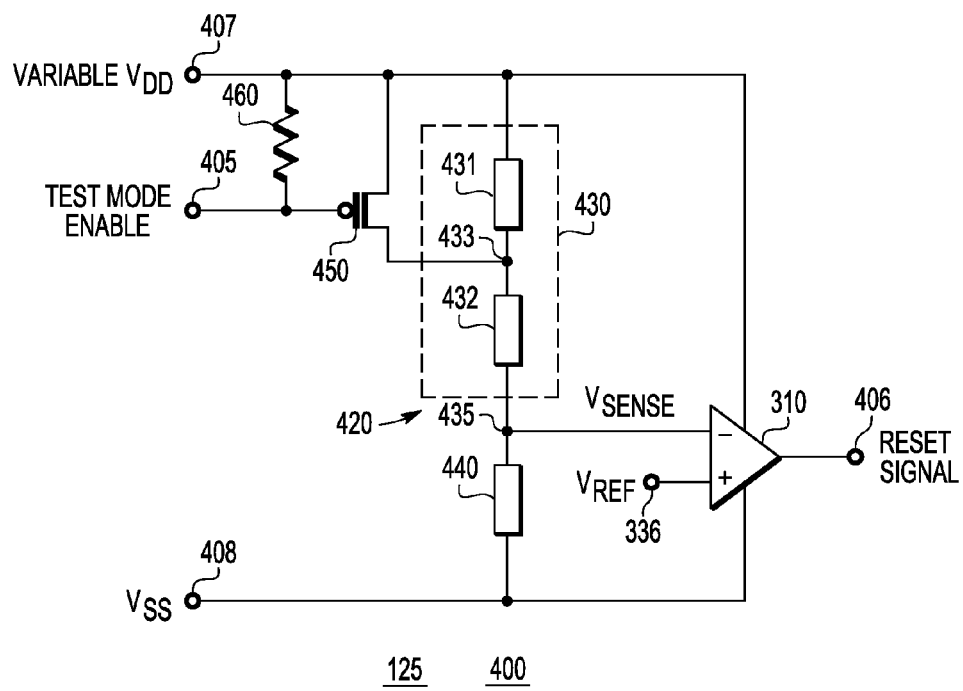
FIG. 4 is a schematic diagram of a circuit of a second embodiment of the selectable threshold reset circuit of FIGS. 1 and 2.

FIG. 4 is a schematic diagram of a circuit 400 of a second embodiment of the selectable threshold reset circuit 125. The circuit 400 includes a comparator 410 that functions similar to comparator 310. The circuit 400 has an input terminal 405 for receiving the TEST MODE ENABLE signal and an output terminal 406 for outputting a RESET signal. The circuit 400 of includes comparator 410. The circuit 400 includes a ladder 420 coupled between a $V_{DD}$ terminal 407 and a $V_{SS}$ terminal 408. The ladder 420 comprises resistive elements 431 and 432 in an upper portion 430, and a resistive element in a lower portion 440. The circuit 400 includes a switch 450. In circuit 400, the switch 450 is a PMOS transistor. PMOS transistor of the switch 450 is normally off, thereby shorting out resistive element 431 from the upper portion 430 of the ladder 420. Circuit 400 of the selectable threshold reset circuit 125 enters the test mode by turning off the PMOS transistor of the switch 450. The PMOS transistor requires a low (logical zero) input signal at its gate to turn on. The low TEST MODE ENABLE signal causes the PMOS transistor of the switch 450 to turn on, or to conduct, and the circuit 400 of the selectable threshold reset circuit 125 thereby enters the test mode. When PMOS transistor of the switch 450 is on, it shorts out resistive element 431 from the upper portion 430 of the ladder 420, thereby decreasing the resistance of the upper portion of the ladder. By decreasing the resistance of the upper portion 430 of the ladder 420, the percent of the power supply voltage that is being sampled at node 435 is increased, and the reset threshold is thereby lowered to the test mode reset threshold.

The circuit 400 includes a pullup resistor 460 coupled between the gate of the PMOS transistor of the switch 450 and the $V_{DD}$ terminal 407. In the absence of a low TEST MODE ENABLE signal, the pullup resistor 460 advantageously maintains the PMOS transistor of the switch 450 in an OFF state. As a result, circuit 400 of the selectable threshold reset circuit 125 does not enter the test mode, and the reset threshold remains at its normal value.

Figure 5:
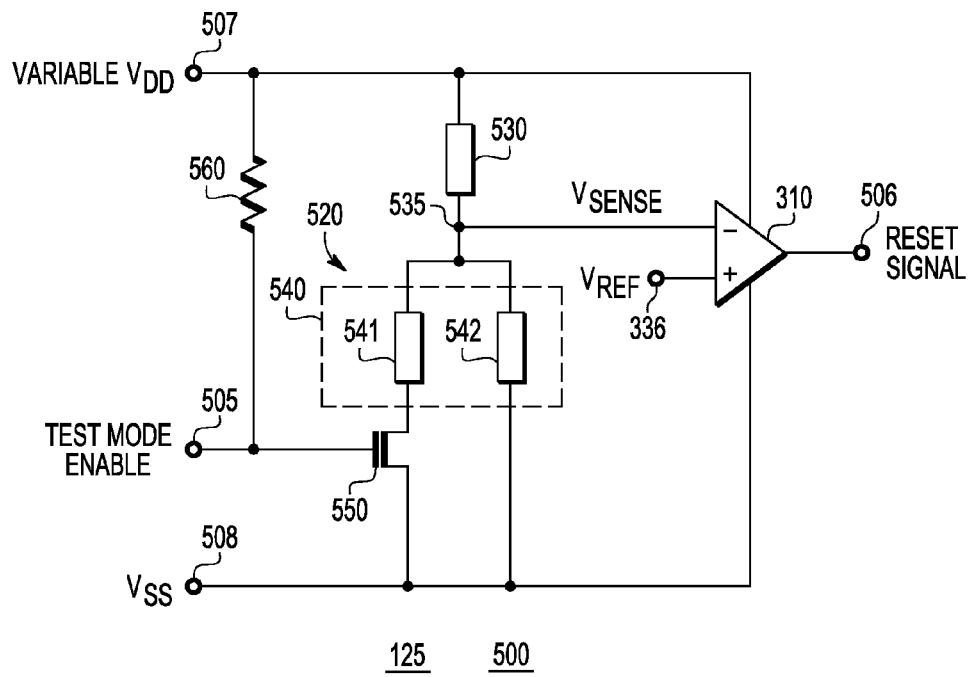
FIG. 5 is a schematic diagram of a circuit of a third embodiment of the selectable threshold reset circuit of FIGS. 1 and 2.

FIG. 5 is a schematic diagram of a circuit 500 of a third embodiment of the selectable threshold reset circuit 125. The circuit 500 includes a comparator 510 that functions similar to comparator 310. The circuit 500 has an input terminal 505 for receiving the TEST MODE ENABLE signal and an output terminal 506 for outputting a RESET signal. The circuit 500 includes a ladder 520 with one end coupled to a $V_{DD}$ terminal 507. The ladder 520 comprises a resistive element in an upper portion 530, and resistive elements 541 and 542 configured parallel to each other, in a lower portion 540. The ladder 520 includes a node 535 between the upper portion 530 and the lower portion 540. One end of resistive element 542 is coupled to node 535 and the other end of resistive element 542 is coupled to a $V_{SS}$ terminal 508. The circuit 500 includes an NMOS transistor as a switch 550. One end of resistive element 541 is coupled to node 535 and the other end of resistive element 541 is coupled to a drain of the NMOS transistor. The source of the NMOS transistor is coupled to the $V_{SS}$ terminal 508 and the gate of the NMOS transistor is coupled to the input terminal 505. The ladder 520 produces a voltage $V_{SENSE}$ at node 535.

The production tester 102 and 202 causes circuit 500 to receive the active-low TEST MODE ENABLE signal, thereby causing the circuit 500 to enter the test mode. The active-low TEST MODE ENABLE signal causes the NMOS transistor of the switch 550 to turn off, or to stop conducting, and the circuit 500 thereby enters the test mode. The NMOS transistor requires a high (logical one) input signal at its gate to turn on. When the NMOS transistor is on, it connects resistive element 541 to the $V_{SS}$ terminal 508, thereby reducing the resistance of the lower portion 540 of the ladder 520. When the circuit 500 is not in the test mode, the NMOS transistor is on, and a certain percent of the power supply voltage is sampled at node 535. When circuit 500 is in the test mode, the NMOS transistor is off, and the percent of the power supply voltage that is being sampled at node 535 changes. When NMOS transistor is off, the percent of the power supply voltage that is being sampled at node 535 is increased. By increasing the percent of the power supply voltage that is being sampled at node 535, the reset threshold is lowered to the test mode reset threshold.

Figure 6:
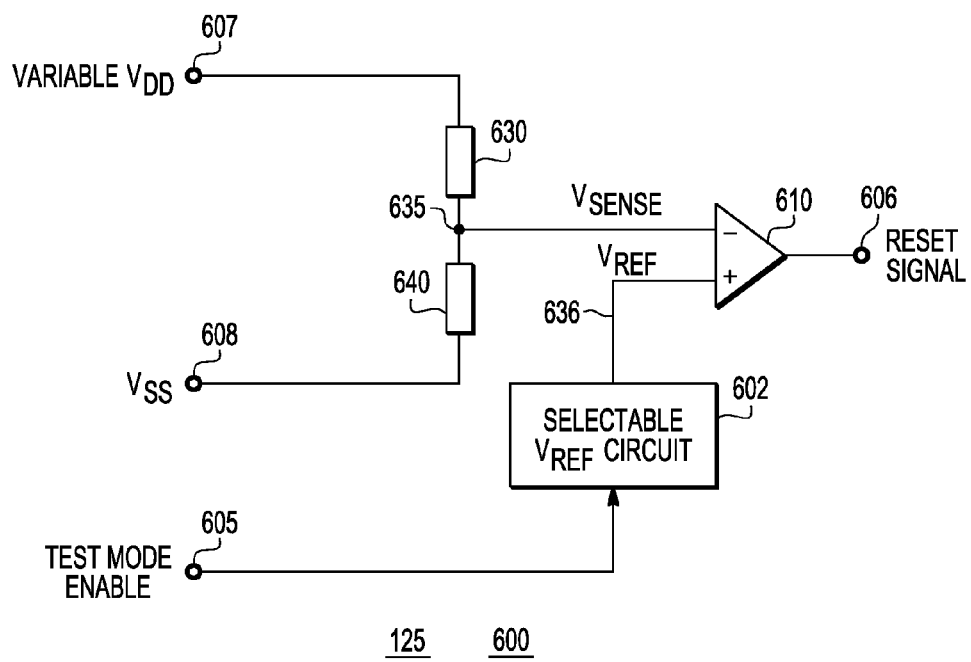
FIG. 6 is a schematic diagram of a circuit of a fourth embodiment of the selectable threshold reset circuit of FIGS. 1 and 2.

FIG. 6 is a schematic diagram of a circuit 600 of a fourth embodiment of the selectable threshold reset circuit 125. The circuit 600 includes a selectable $V_{REF}$ circuit 602 that has an input terminal for receiving the TEST MODE ENABLE signal and an output terminal for outputting a selectable value of $V_{REF}$ to a comparator 610. The selectable value of $V_{REF}$ outputted by the selectable $V_{REF}$ circuit 602 to the comparator 610 is based on a bandgap voltage from a reference circuit that is not shown in FIG. 6. The comparator 610 of FIG. 6 is a standard comparator, in contrast to the bandgap comparator 310 of FIGS. 3, 4 and 5.

One embodiment of the selectable $V_{REF}$ circuit 602 includes an amplifier circuit (not shown) that has an appropriate gain or attenuation, controlled by the TEST MODE ENABLE signal, using the previous described bandgap voltage reference circuit as a reference, thereby changing the value of $V_{REF}$ inputted into an input terminal 636 of the comparator 610. In such case, one value of $V_{REF}$ is inputted into the comparator 610 during normal mode, and another value of $V_{REF}$ is inputted into the comparator during test mode.

Another embodiment of the selectable $V_{REF}$ circuit 602 includes second bandgap voltage reference circuit (not shown) that generates a second $V_{REF2}$ different than $V_{REF}$, wherein the input terminal 636 of the comparator 610 is multiplexed between $V_{REF}$ and $V_{REF2}$. In such case, the one bandgap voltage reference circuit that generates $V_{REF}$ is used during normal mode, and the second bandgap voltage reference circuit that generates $V_{REF2}$ is used during test mode, and the multiplexing is controlled by the TEST MODE ENABLE signal.

Yet another embodiment of the selectable $V_{REF}$ circuit 602 includes a digital-to-analog converter (DAC), wherein the output of the DAC is controlled by the TEST MODE ENABLE signal.

Still another embodiment of the selectable $V_{REF}$ circuit 602 includes a resistor divider network based on either the bandgap reference or the unregulated supply (see FIG. 1), but not based on a voltage from the programmable $V_{DD}$ regulator 223, wherein the resistor divider network is controlled by the TEST MODE ENABLE signal.

In each of the embodiments of the selectable $V_{REF}$ circuit 602, the value of $V_{REF}$ inputting into the input terminal 636 of the comparator 610 is decreased, by the selectable $V_{REF}$ circuit 602, in response to the TEST MODE ENABLE signal, from a normal value to a lower value when the selectable threshold reset circuit 125 enters the test mode.

The low voltage testing system 100 and 200 allows package level, logic operation at a $V_{DD}$ less than a normal voltage without disabling the reset circuit. Also, the low voltage testing system 200 allows package-level logic operation at a $V_{DD}$ less than the normal reset threshold without external pin access to the reset circuit or to $V_{DD}$. Unlike some known circuits, with the low voltage testing system 100 and 200, during a low voltage test, the selectable threshold reset circuit 125 does not become disabled, and the RESET signal is not inhibited.

The $V_{DD}$ regulator 223 and the selectable threshold reset circuit 125 are controlled in concert by SPI or test mode pins. When performing a low voltage test, or scan, $V_{DD}$ is reduced from its nominal value, for example, 2.5V, to a lower value, for example, 1.75V, as dictated by a fabrication process of the integrated circuit. At the same time, the reset threshold is reduced from its nominal value, e.g., 2.0V, to a lower value, e.g., 1.65V.

The low voltage testing system 100 and 200 coordinates control of the selectable threshold reset circuit 125 and the programmable $V_{DD}$ regulator 223. During a low voltage test, or scan, the low voltage testing system 100 and 200 synchronizes the reduction of $V_{DD}$ with the lowering of the reset threshold. The low voltage testing system 100 and 200 includes local pullup on a control pin to establish a correct start-up start. The low voltage testing system 100 and 200 allows a low voltage test to be performed at package level without disabling a reset circuit and without adding pins.

Advantageously, the selectable threshold reset circuit 125 remains operable even in faulted conditions. In the presence of a fault, e.g., a metal defect in the integrated circuit that causes second line 117, which carries the TEST MODE ENABLE signal, to be always active (logical high), the selectable threshold reset circuit 125 is still functional and operational (although it may be parametrically incorrect), thereby ensuring a proper logic reset during a power-up sequence.

The resistive elements can include three-terminal diffused resistors, two-terminal polysilicon resistors, metal resistors, NiCad resistors, or transistors configured to act as resistors.

In one embodiment, the selectable threshold reset circuit 125 is disposed on an integrated circuit fabricated using a complementary metal oxide semiconductor (CMOS) process. In one embodiment, the selectable threshold reset circuit 125 comprises thin-oxide transistors. In another embodiment, the selectable threshold reset circuit 125 comprises dual gate oxide (DGO) transistors. Although, in one exemplary embodiment, the selectable threshold reset circuit 125 is disposed on an integrated circuit fabricated using CMOS technology, the amplifier circuit can also be disposed on an integrated circuit fabricated using other technologies.

Although the invention is described herein with reference to specific embodiments, various modifications and changes can be made without departing from the scope of the present invention as set forth in the claims below. For instance, although the exemplary embodiments show that the selectable threshold reset circuit 125 is disposed on an integrated circuit, the invention is equally usable when constructed entirely of components consisting of discrete devices. Although one embodiment of the selectable threshold reset circuit 125 may comprise FETs, another embodiment of the selectable threshold reset circuit 125 may comprise bipolar junction transistors.

Although the invention has been described with respect to specific conductivity types or polarity of potentials, skilled artisans appreciated that conductivity types and polarities of potentials may be reversed.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:

1. A selectable threshold reset circuit coupled to a first power supply terminal and a second power supply terminal, comprising:
   a voltage-divider circuit, coupled to the first power supply terminal and to the second power supply terminal, for producing a $V_{SENSE}$ voltage that is a fraction of a voltage at the first power supply terminal;
   a comparator having a first input terminal coupled to the voltage-divider circuit, a second input terminal coupled to a reference voltage, and an output terminal for outputting a RESET signal when the first power supply terminal is at a voltage equal to or less than a reset threshold of the selectable threshold reset circuit; and
   a switch for controlling the voltage-divider circuit, the switch having a first switch terminal coupled to the voltage-divider circuit, a second switch terminal coupled to the second power supply terminal, and an input terminal for activating the switch, such that,
      when the switch is in a first state and the first power supply terminal is at a normal voltage level, the RESET signal is outputted at a normal reset threshold, and,
      when the switch is in a second state and the first power supply terminal is at a test mode voltage level that is less than the normal voltage level, the RESET signal is outputted at a test mode reset threshold that is less than the normal reset threshold.

2. The selectable threshold reset circuit of claim 1, in which the comparator compares the $V_{SENSE}$ voltage with the reference voltage, and in which the $V_{SENSE}$ voltage is larger when the switch is in the first state than when the switch is in the second state.

3. The selectable threshold reset circuit of claim 1, in which the selectable threshold reset circuit is coupled to a circuit under test, the circuit under test being coupled to the power supply, and in which the voltage level of the power supply is reduced when the switch is activated to be in the second state.

4. The selectable threshold reset circuit of claim 1, in which the voltage-divider circuit is a voltage-divider ladder that includes:

a first portion coupled between a first input terminal of the comparator and the first power supply terminal, and a second portion coupled between the first input terminal of the comparator and the second power supply terminal, wherein the voltage-divider ladder generates the $V_{SENSE}$ voltage at a node between the first portion and the second portion.

5. The selectable threshold reset circuit of claim 4, in which the second portion of the voltage-divider ladder includes:

a first resistor coupled between the first input terminal of the comparator and an intermediate node of the second portion, and a second resistor coupled between the intermediate node of the second portion and the second power supply terminal, and in which the first switch terminal is coupled to the intermediate node of the second portion.

6. The selectable threshold reset circuit of claim 5, in which a voltage level of the first power supply terminal is reduced to less than the normal voltage level after the switch is closed.

7. The selectable threshold reset circuit of claim 5, including a pullup resistor coupled between the switch and the first power supply terminal, such that the reset threshold remains at the normal voltage level in absence of a signal at the input terminal of the switch.

8. The selectable threshold reset circuit of claim 5, in which the switch includes an NMOS transistor having a gate coupled to the input terminal of the switch, a drain coupled to an intermediate node of the lower portion of the voltage-divider ladder, and a source coupled to the second power supply terminal.

9. The selectable threshold reset circuit of claim 8, including a pullup resistor coupled between the gate of the NMOS transistor and the first power supply terminal, such that the pullup resistor maintains the NMOS transistor in an ON state unless a logical zero signal is present at the gate of the NMOS transistor.

10. The selectable threshold reset circuit of claim 4, in which the switch controls a topology of the voltage-divider ladder, the switch having a first switch terminal coupled to the second portion, a second switch terminal coupled to the second power supply terminal, and an input terminal for activating the switch, such that, when the switch is closed and the first power supply terminal is at a normal voltage level, the RESET signal is outputted at a normal reset threshold, and, when the switch is open and the first power supply terminal is at a test mode voltage level that is less than the normal voltage level, the RESET signal is outputted at a test mode reset threshold that is less than the normal reset threshold.

11. The selectable threshold reset circuit of claim 10, in which a ratio between the test mode reset threshold and the normal reset threshold is proportional to a ratio between the test mode voltage level of the power supply and the normal voltage level of the power supply.

12. A method of performing a low voltage test of a circuit within an integrated circuit package, comprising:

setting a power supply of a circuit under test and a reset circuit at a normal voltage level, the circuit under test and the reset circuit being within an integrated circuit package, the reset circuit having an input terminal for receiving a TEST MODE ENABLE signal, wherein the reset circuit outputs a RESET signal to the circuit under test when a voltage level of the power supply is at a reset threshold, and wherein the reset threshold of the reset circuit is selectable to one of a normal reset threshold and a test mode reset threshold, depending on a value of the TEST MODE ENABLE signal;

providing the TEST MODE ENABLE signal to the reset circuit such that the value of the TEST MODE ENABLE signal causes the reset circuit to output the RESET signal to the circuit under test when the voltage level of the power supply is at or below the test mode reset threshold;

reducing the voltage level of the power supply of the reset circuit and the circuit under test to a test mode voltage level, wherein the test mode voltage level is less than the normal reset threshold of the reset circuit; and determining operation of the circuit under test when the voltage level of the power supply of the circuit under test is at the test mode voltage level.

13. The method of claim 12, wherein a ratio between the test mode reset threshold and the normal reset threshold is proportional to a ratio between the test mode voltage level of the power supply and the normal voltage level of the power supply.

14. The method of claim 12, in which providing the TEST MODE ENABLE signal to the reset circuit and the circuit under test occurs concurrently with reducing the voltage level of the power supply of the circuit under test to the test mode voltage level.

15. The method of claim 12, in which the reset threshold remains at the normal reset threshold in absence of a signal at the input terminal of the reset circuit.

16. A selectable threshold reset circuit coupled to a first power supply terminal and a second power supply terminal, comprising:

a voltage-divider circuit coupled between the first power supply terminal and the second power supply terminal, for producing, at a node, a voltage that is a fraction of a voltage at the first power supply terminal;

a comparator having a first input terminal coupled to the node of the voltage-divider circuit, a second input terminal coupled to a reference voltage, and an output terminal for outputting a RESET signal when the first power supply terminal is at a voltage equal to or less than a reset threshold of the selectable threshold reset circuit;

an input terminal for receiving a test signal; and an output terminal, such that, when the test signal is in a first state and the first power supply terminal is at a normal voltage level, the RESET signal is outputted at a normal reset threshold, and, when the test signal is in a second state and the first power supply terminal is at a test mode voltage level that is less than the normal voltage level, the RESET signal is outputted at a test mode reset threshold that is less than the normal reset threshold.

17. The selectable reset circuit of claim 16, in which the selectable reset circuit is coupled to a circuit under test that resides within a same integrated circuit package in which the selectable reset circuit resides, the circuit under test coupled to the first power supply terminal, to the second power supply terminal, and to the output terminal, and in which the circuit under test is reset when it receives the RESET signal.

18. The selectable reset circuit of claim 17, in which the selectable reset circuit is coupled to a production tester, the production tester coupled to the first power supply terminal, to the second power supply terminal, and to the input terminal, the production tester for generating the test signal and for reducing a voltage level of the first power supply terminal to below a voltage level of a normal reset threshold, wherein a ratio between the test mode reset threshold and the normal reset threshold is proportional to a reduction in the voltage level of the first power supply terminal.

19. The selectable reset circuit of claim 16, in which the second input terminal of the comparator is coupled to a bandgap voltage reference circuit.

20. The selectable reset circuit of claim 16, including a selectable $V_{REF}$ circuit for producing the reference voltage, the selectable $V_{REF}$ circuit having an output terminal coupled to the second input terminal of the comparator, and having an input terminal for receiving the test signal, wherein a value of the reference voltage is dependent upon a value of the test signal.

* * * * *